(12) United States Patent
Kim

(10) Patent No.: US 7,196,575 B2
(45) Date of Patent: Mar. 27, 2007

(54) POLYPHASE IMPEDANCE TRANSFORMATION AMPLIFIER

(75) Inventor: Larry Kim, East Lansing, MI (US)

(73) Assignee: JAM Technologies, Inc., Boston, MA (US)

( * ) Notice: Subject to any disclaimer, the term of this patent is extended or adjusted under 35 U.S.C. 154(b) by 0 days.

(21) Appl. No.: 10/514,306

(22) PCT Filed: May 13, 2003

(86) PCT No.: PCT/US03/14957

§ 371 (c)(1),
(2), (4) Date: Nov. 12, 2004

(87) PCT Pub. No.: WO03/096525

PCT Pub. Date: Nov. 20, 2003

(65) Prior Publication Data

US 2005/0200403 A1     Sep. 15, 2005

Related U.S. Application Data

(60) Provisional application No. 60/380,436, filed on May 13, 2002.

(51) Int. Cl.
*H03F 3/38*     (2006.01)

(52) U.S. Cl. .................. 330/10; 330/251; 330/207 A
(58) Field of Classification Search ............... 330/10, 330/251, 207 A
See application file for complete search history.

(56) References Cited

U.S. PATENT DOCUMENTS

| | | | |
|---|---|---|---|
| 3,931,581 A | 1/1976 | Kush, Jr. et al. | 330/10 |
| 5,610,553 A | 3/1997 | Kirn | 330/10 |
| 5,898,340 A * | 4/1999 | Chatterjee et al. | 330/251 |
| 5,963,086 A | 10/1999 | Hall | 330/10 |
| 6,026,126 A * | 2/2000 | Gaetano | 375/296 |
| 6,462,964 B2 * | 10/2002 | Porter et al. | 363/21.01 |
| 6,509,793 B2 | 1/2003 | Kim | 330/10 |
| 6,778,012 B2 * | 8/2004 | Kirn | 330/10 |
| 2002/0125941 A1 | 9/2002 | Nguyen | 330/10 |
| 2003/0039129 A1 | 2/2003 | Miyazaki et al. | 363/26 |

* cited by examiner

*Primary Examiner*—Patricia Nguyen
(74) *Attorney, Agent, or Firm*—Gifford, Krass, Groh, Sprinkle, Anderson & Citkowski, PC

(57) ABSTRACT

A method and apparatus for greatly increasing the output voltage or current transformation ratio in an impedance transformation amplifier are disclosed. Broadly, the method takes advantage of multiple, phase-synchronized impedance transformation stages, each of which preferably contributes an equal portion of the eventual output voltage or current.

5 Claims, 2 Drawing Sheets

POLYPHASE IMPEDANCE TRANSFORMATION AMPLIFIER

REFERENCE TO RELATED APPLICATION

This application claims priority from U.S. Provisional Patent Application Ser. No. 60/380,436, filed May 13, 2002, the entire content of which is incorporated herein by reference.

FIELD OF THE INVENTION

This invention relates generally to impedance transformation amplifiers, and in particular, to techniques for increasing the output voltage or current transformation ratio in an amplifier of this kind.

BACKGROUND OF THE INVENTION

Impedance transformation amplifiers, as described in U.S. Pat. No. 5,610,553, entitled "Switching Amplifier with Impedance Transformation Output Stage" and incorporated herein by reference, provide output voltage or current exceeding that of the input without the use of a transformer. The maximum voltage or current amplification ratio is limited at low load impedances, however, if high efficiency is to be obtained. Typical voltage ratios with loads under eight ohms are typically limited to 4:1 or less. In some limited voltage applications, the maximum obtainable ratio does not provide adequate power. There exists a need to increase the output amplification ratio in impedance transformation amplifiers, so as to extend their use in higher-power applications.

SUMMARY OF THE INVENTION

This invention resides in a method and apparatus for greatly increasing the output voltage or current transformation ratio in an impedance transformation amplifier. Broadly, the method takes advantage of multiple, phase-synchronized impedance transformation stages, each of which preferably contributes an equal portion of the eventual output voltage or current.

DETAILED DESCRIPTION OF THE INVENTION

Figure 1:
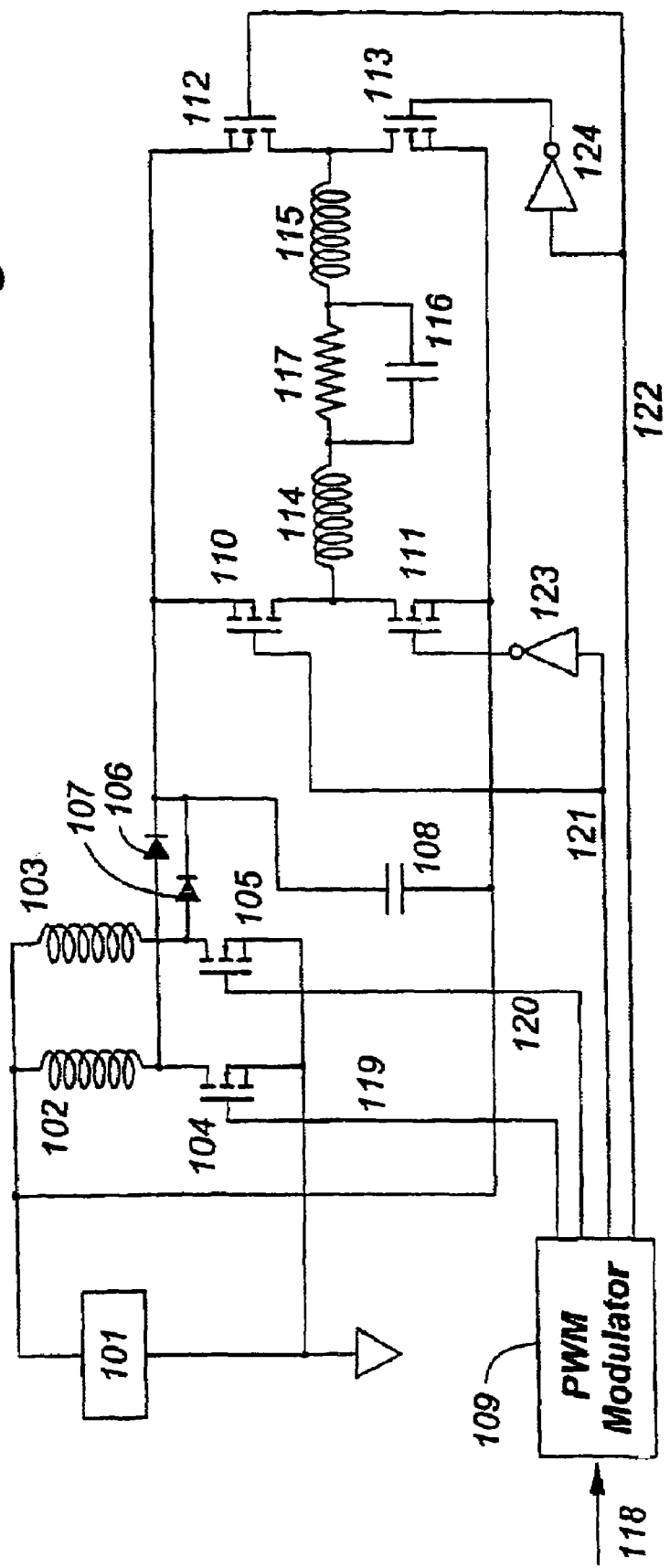
FIG. 1 shows a preferred embodiment of the present invention.

Referring now to FIG. 1, voltage source 101 supplies power for all subsequently noted actions. Switching device 104 charges inductor 102 under the control of signal 119 from PWM Modulator 109, which provides control signals in response to the receipt of incoming data stream 118. Standard pulse-width modulation techniques are preferably used.

At the termination of signal 119, inductor 102 releases its stored charge through diode 106 into capacitor 108. Following this cycle of events, switching device 105 charges inductor 103 under the control of signal 120 from PWM Modulator 109. At the termination of signal 120, inductor 103 releases its stored charge through diode 107 into capacitor 108. Alternately, it can be seen that energy representative of incoming data 118 is stored at the voltage of source 101 in either inductor 102 or 103, and released into capacitor 108 at another voltage.

Control signals on lines 121 and 122 are controlled by PWM Modulator 109 to reflect the sign of incoming data 118. Such operation may occur statically or dynamically, according to various practices in the art. Control signals 121 and 122 serve to activate switching devices 110 and 112, respectively, while deactivating switching devices 111 and 113, respectively, through the operation of inverters 123 and 124.

The net effect of the above is that charge stored in capacitor 108 is made available to one terminal of load 117 through either switching device 110 and inductor 114, or switching device 112 and inductor 115, thereby controlling direction of current flow through load 117. Inductors 114 and 115, in conjunction with capacitor 116 serve to filter out alias products inherent in the sampling process. Current return for load 117 is effected through either switching device 111 or 113 to voltage source 101. This connection method allows output available at load 117 to approach zero.

Figure 2:
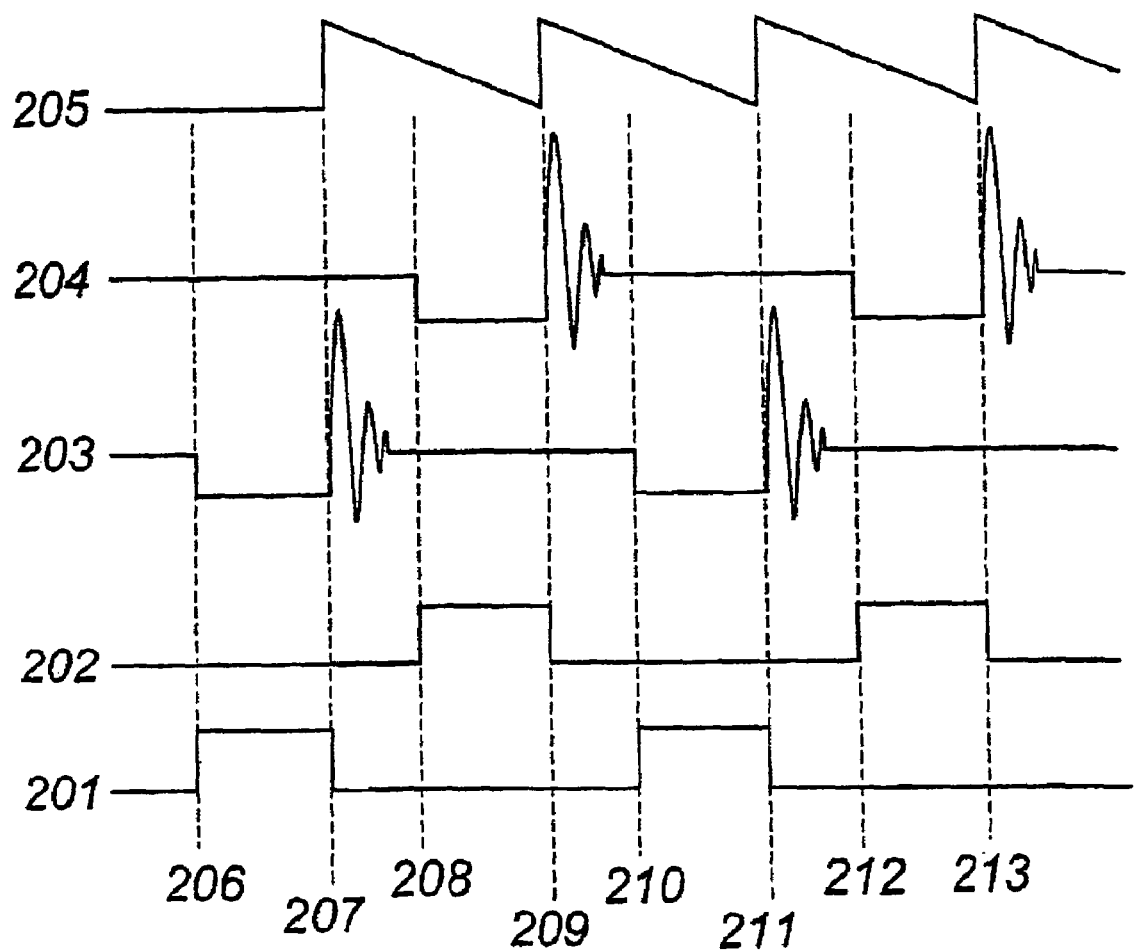
FIG. 2 shows voltage waveforms of control and output signals with respect to the circuitry of FIG. 1.

Referring now to FIG. 2, trace 201 and 202 show activity of control signals 119 and 120, respectively, of FIG. 1. Traces 203 and 204 show activity of the cathodes of diodes 106 and 107, respectively, hence voltage potential of inductors 102 and 103, respectively, of FIG. 1. Trace 205 shows activity at the common connection of diodes 106 and 107, capacitor 108, and switching devices 110 and 112, all of FIG. 1; hence the instantaneous voltage produced by the actions described herein.

At time 206, control signal 119 is asserted in trace 201, the result of which can be seen at diode 106 in trace 203. At time 207, release of control signal 119, seen in trace 201, produces a flyback voltage from inductor 102, seen in trace 203. This flyback voltage, conducted through diode 106, results in a potential increase across capacitor 108, seen in trace 205. Subsequent assertion and deassertion of control signal 120, seen at times 208 and 209, respectively, result in a similar flyback voltage from inductor 103, seen in trace 204 at time 209, and a potential increase across capacitor 118, as seen in trace 205 at this time.

Note that use of two alternate inductor flyback periods results in possible charge periods twice that of the output period (the period that would be available to an inductor of a single stage) for each inductor. This period multiplication holds true for subsequent flyback stage additions, i.e., use of three inductors allows inductor charge periods three times that of the output period, etc. In that doubling the inductor charge period available doubles its maximum current, the resultant maximum flyback voltage therefore doubles for any given load resistance. Resultant output power of an impedance transformation amplifier of this topology then becomes that of the voltage transformation ratio in use multiplied by the square of the number of stages used.

I claim:

1. A polyphase impedance transformation amplifier connecting an input signal to a load, comprising:
    a pulse-width modulator (PWM);
    gated switches controlled by the PWM for routing energy from a power source to the load in accordance with the input signal; and
    a plurality of impedance-transformation stages, each controlled by the PWM for routing energy from a power supply to the power source, thereby increasing the output transformation ratio at the load.

2. The impedance transformation amplifier of claim 1 wherein each impedance-transformation stage includes an inductor in series with a gated switch controlled by the PWM.

3. The circuitry of claim 1, wherein each impedance-transformation stage contributes an equal portion of the energy coupled to the load.

4. A method of increasing the output amplification ratio in an impedance transformation amplifier driving a load with gated switches, comprising the steps of:

providing a plurality of phase-synchronized impedance-transformation stages connected between a source of power and the gated switches; and pulse-width modulating the transformation stages such that each contributes a respective portion of the voltage or current through the load.

5. The method of claim 4, wherein each impedance transformation stage contributes a substantially equal portion of the voltage or current through the load.

* * * * *